United States Patent [19]

Abrokwah et al.

[11] Patent Number: 5,444,016

[45] Date of Patent: Aug. 22, 1995

[54] METHOD OF MAKING OHMIC CONTACTS TO A COMPLEMENTARY III-V SEMICONDUCTOR DEVICE

[76] Inventors: Jonathan K. Abrokwah, 1963 E. Ranch Rd., Tempe, Ariz. 85284; Jenn-Hwa Huang, 1426 W. Tara Dr., Gilbert, Ariz. 85234; Jaeshin Cho, 507 E. Page Ave., Gilbert, Ariz. 85234

[21] Appl. No.: 83,751

[22] Filed: Jun. 25, 1993

[51] Int. Cl.6 ................ H01L 21/44; H01L 21/48
[52] U.S. Cl. .................... 437/184; 437/912; 437/192; 148/DIG. 20; 148/DIG. 65; 257/195
[58] Field of Search .................. 437/184–185, 437/912, 192, 186; 148/DIG. 20, DIG. 63, DIG. 65; 257/195

[56] References Cited

U.S. PATENT DOCUMENTS

| | | | |
|---|---|---|---|
| 3,684,930 | 8/1972 | Collins et al. | 156/622 |
| 4,188,710 | 2/1980 | Davey et al. | 317/234 R |
| 4,313,971 | 2/1982 | Wheatley, Jr. | 427/84 |
| 4,540,446 | 9/1985 | Nonaka et al. | 257/195 |
| 4,712,291 | 12/1987 | McLeuge | 437/27 |
| 4,729,000 | 3/1988 | Abrokwah | 257/195 |
| 4,746,627 | 5/1988 | Zuleeg | 437/126 |
| 4,814,851 | 3/1989 | Abrokwah et al. | 257/195 |
| 4,830,980 | 5/1989 | Hsieh | 437/56 |
| 4,833,042 | 5/1989 | Waldrop et al. | 428/641 |
| 4,989,065 | 1/1991 | Tsuchimoto et al. | 437/184 |
| 4,998,158 | 3/1991 | Johnson et al. | 257/195 |
| 5,045,502 | 9/1991 | Lau et al. | 437/184 |
| 5,060,031 | 10/1991 | Abrokwah et al. | 257/195 |
| 5,091,338 | 2/1992 | Tsuchimoto et al. | 437/184 |
| 5,093,280 | 3/1992 | Tully | 437/184 |
| 5,100,835 | 3/1992 | Zheng | 437/184 |
| 5,116,774 | 5/1972 | Huang et al. | 437/40 |
| 5,144,410 | 9/1992 | Johnson | 257/195 |
| 5,214,298 | 5/1993 | Yuan et al. | 257/195 |
| 5,275,971 | 1/1994 | Wu et al. | 437/184 |
| 5,281,842 | 1/1994 | Yasuda et al. | 257/371 |
| 5,389,564 | 2/1995 | Bernhardt | 437/40 |

FOREIGN PATENT DOCUMENTS

| | | |
|---|---|---|
| 2359640 | 6/1975 | European Pat. Off. |
| 59-84580 | 5/1984 | Japan .............. 257/195 |
| 62-149125 | 12/1985 | Japan . |
| 62-149138 | 12/1985 | Japan . |
| 63-95620 | 10/1986 | Japan . |

OTHER PUBLICATIONS

R. J. Graham et al., "Investigation of the Structural and Electrical Properties of Al–Ge–Ni Contacts to GaAs." Journal of Electronic Materials, vol. 19, No. 11, 1990, pp. 1257–1263.

C. C. Han et al., "Thermally stable and nonspiking Pd/Sb (Mn) ohmic contact to p–GaAs," Appl. Phys. Lett. 58 (15), 15 Apr. 1991, pp. 1617–1619.

E. Kolawa et al., "Stable Solid–Phase Contact to n–GaAs", IEEE Transactions on Electron Devices, vol. 36 No. 6, Jun. 1989, pp. 1223–1225.

(List continued on next page.)

*Primary Examiner*—Olik Chaudhuri
*Assistant Examiner*—H. Jey Tsai
*Attorney, Agent, or Firm*—Aaron B. Bernstein

[57] ABSTRACT

The present invention encompasses a method for providing the same ohmic material contact (120, 122, 124) to N-type and P-type regions (70, 80) of a III-V semiconductor device. Specifically, an N-type region (70) extending through a semiconductor structure is formed. Additionally, a P-type region (80) extending through the substrate is formed. The P-type region (80) may be heavily doped with P-type impurities (81). A first ohmic region (117) is formed, contacting the N-type region (70). The first ohmic region may comprise an ohmic material including metal and an N-type dopant. A second ohmic region (119) is formed, contacting the P-type region (80, 81). The second ohmic region comprises the same ohmic material as the first ohmic region. One ohmic material that may be used is nickel-germanium-tungsten.

6 Claims, 4 Drawing Sheets

OTHER PUBLICATIONS

S. Swirhun et al., Third Int. Conf. Indium Phosphide and Related Materials, 8 Apr. 1991, Cardiff, Wales, UK, pp. 238–241 (the whole document).

R. J. Graham et al., Journal of the Electrochemical Society, Jan. 1988, Manchester, N.H., U.S., vol. 135, No. 1, pp. 266–267 (the whole document).

N. Lustig et al., Applied Physics Letters, 13 May 1991, New York, US, vol. 58, No. 19, pp. 2093–2095 (p. 2093).

R. J. Roedel et al., Journal of the Electrochemical Society, May 1993, Manchester, N.H., US, vol. 140, No. 5, pp. 1450–1453 (p. 1450).

IBM Technical Disclosure Bulletin, Jan. 1992, New York, US, vol. 34, No. 8, pp. 470–475 (p. 473).

Halali et al., Thermally Stable In-based Ohmic Contacts to P-Type GaAs'—the whole document, Proceedings of the 18th International Symposium on Gallium Arsenide and Related Compounds, Sep., 1991, pp. 179–182.

M. Murakami, Indium Based Ohmic Contacts To n And p-Type GaAs'—the whole document, Extended Abstracts, No. 437, Oct. 1990, p. 638.

D. Davito et al., Ohmic Contacts to p-and n-type GaAs Made with Al-Sn-Ni', Journal of the Electrochemical Society, vol. 140, No. 5, May 1993, pp. 1450–1453.

T. C. Shen et al., Recent Developments in Ohmic Contacts for III-V Compound Semiconductors, Journal of Vacuum Science and Technology: Part B, vol. 10, No. 5, Oct. 1992, pp. 2113–2132.

M. Murakami et al., Thermally Stable, Low-Resistance NiInWNx Ohmic Contacts to N-Type GaAs Prepared By Sputter Deposition, Applied Physics Letters, vol. 59, No. 4, Nov. 1991.

E. Kolawa et al., Solid Phase Ni/Ge Ohmic Contacts to GaAs with W-N Diffusion Barriers, Journal of Electrochemical Society, vol. 133, No. 9, Sep. 1986, the whole document.

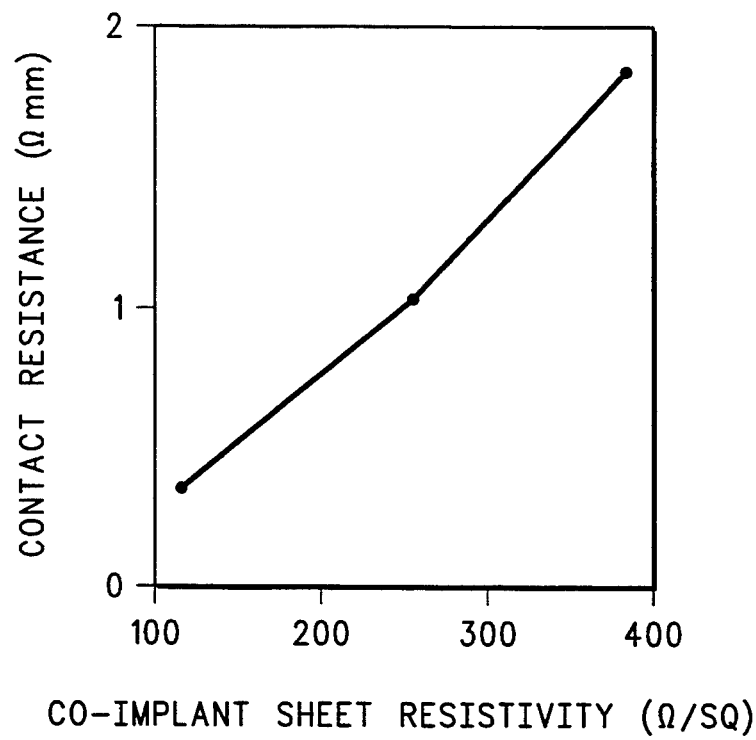
FIG. 11
FIG. 12
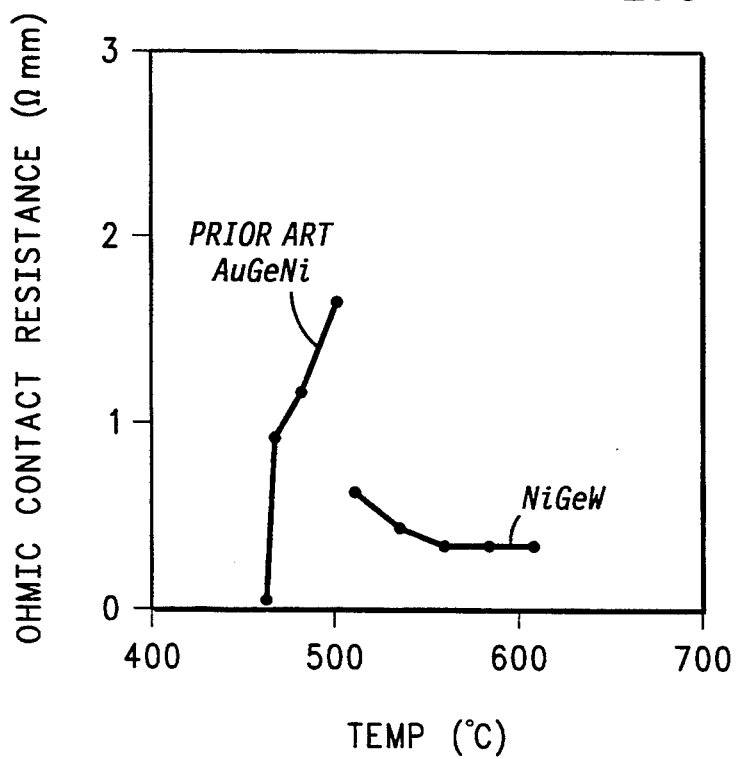

METHOD OF MAKING OHMIC CONTACTS TO A COMPLEMENTARY III-V SEMICONDUCTOR DEVICE

This application is related to co-pending patent application "III-V COMPLEMENTARY HETEROSTRUCTURE DEVICE WITH COMPATIBLE NON-GOLD OHMIC CONTACTS", Ser. No. 08/083,755, filed by Jonathan K. Abrokwah et al. concurrently with the present application.

BACKGROUND OF THE INVENTION

The present invention relates, in general, to ohmic contacts, and more particularly, to ohmic contacts used for semiconductor devices.

Complementary semiconductor devices, and specifically III-V complementary heterostructure field effect transistors (CHFETs) or complementary heterostructure insulated gate field effect transistors (CHIGFETs) have been shown to be extremely useful for low power, low voltage and high speed applications. See, for example, "Low Power AlGaAs/GaAs Complementary FETs Incorporating InGaAs N-channel Gates," Abrokwah, U.S. Pat. No. 4,729,000 and "High Transconductance Complementary (Al, Ga) As/GaAs Heterostructure Insulated Gate Field-Effect Transistors," Abrokwah et al, U.S. Pat. No. 4,814,851. The prior art discloses complementary gallium arsenide (GaAs) heterostructure devices using self-aligned ion implantation technology. CHIGFETs are CMOS-like devices using a wide bandgap insulator, such as aluminum gallium arsenide (AlGaAs) or aluminum indium arsenide (AlInAs) to confine high mobility two-dimensional electron or hole gases in the channel, for carrier transport. The two-dimensional gases are formed close to the heterojunction of the wide bandgap material insulator and the narrow bandgap material channel. A typical channel material is pseudomorphic $In_xGa_{1-x}As$. The prior art, however, exhibits several drawbacks with respect to the ohmic contact metallization employed for electrically contacting the active regions of the devices.

The complementary nature of the devices of course implies that they include both N-type and P-type devices on the same substrate. The typical ohmic metallization of the prior art is different for N-type and P-type devices. For N-type, gold germanium nickel (AuGeNi) has been used. For P-type, gold zinc nickel (AuZnNi) or gold zinc gold (AuZnAu) has been used. Both ohmic contacts rely on Au metallization for low resistance, resulting in several disadvantages. The Au-based ohmics are not etchable. Consequently, they must be defined on the device by a lift-off process. As is well understood in the art, lift-off is associated with relatively poor yields and poor pattern definition, and thus limits device geometries to relatively large dimensions. The large dimensions decrease the maximum number of devices which can fit in a given space.

The Au-based ohmics of the prior art also exhibit the disadvantage of being incompatible with modern Al VLSI metallization used for multi-layer integrated circuit interconnections. The incompatibility stems from the fact that the Au-based ohmics fail to provide a stable ohmic contact through the temperature range required for the Al multi-layer technology. Specifically, the typical Al based interconnect processes occur at or above about 500° C. Au-based ohmics fail to provide stable ohmic contacts above about 470° C. Consequently, the Au-based ohmics of the prior art limit the commercial application of the complementary devices. Furthermore, over time Au tends to react with the Al, creating a problem known as purple plaque which eventually causes failure of the device.

An additional disadvantage of the ohmics of the prior art is that poor contact morphology results from complex reactions of Au with GaAs.

Moreover, a distinct disadvantage results from the prior art ohmic contacts in that two different respective materials are used for the N-type and the P-type devices. As is well understood, the use of separate materials substantially increases the complexity of device processing, which leads to increased costs, increased cycle times, increased safety risks, decreased yields, etc.

Accordingly, what is needed is an ohmic contact suitable for III-V complementary devices which can be used for both N-type and P-type devices, as well as be compatible with modern multi-layer Al VLSI interconnections while avoiding all of the other discussed drawbacks of the prior art. Additionally, it is desirable to have a complementary heterostructure field effect device which employs such an ohmic contact.

SUMMARY OF THE INVENTION

Briefly stated, the scope of the present invention encompasses a method for providing the same ohmic material contact to N-type and P-type regions of a III-V semiconductor device. Specifically, an N-type region extending through a semiconductor substrate or epilayers is formed. Additionally, a P-type region extending through the substrate or epilayers is formed. A first ohmic region is formed, contacting the N-type region. The first ohmic region comprises a particular ohmic material. A second ohmic region is formed, contacting the P-type region. The second ohmic region comprises the same ohmic material as the first ohmic region.

Furthermore, in accordance with the present invention, the P-type region may be heavily doped with P-type impurities. Also, the particular ohmic material may comprise metal and an N-type dopant.

The scope of the present invention additionally encompasses a method for making a gallium arsenide complementary semiconductor device. A N-type region is formed in a semiconductor substrate or epilayers, by means of ion implantation. A P-type region is also formed in the semiconductor substrate. The P-type region is heavily doped by co-implanting species such as fluorine and beryllium As/Be, N/Be or P/Be, to create a sheet resistance in the range of 250–400 ohms per square. The N-type and P-type regions are activated by thermal annealing. Nickel is deposited on the N-type region and the P-type region. Germanium is deposited on the nickel. Tungsten is deposited on the germanium.

BRIEF DESCRIPTION OF THE DRAWINGS

FIG. 11 is a graphical representation illustrating ohmic contact resistance versus P-region sheet resistivity; and FIG. 12 is a graphical representation illustrating ohmic contact resistance as a function of temperature, comparing the prior art ohmic contact with the preferred ohmic contact.

DETAILED DESCRIPTION OF THE DRAWINGS

Generally stated, a preferred embodiment of the ohmic contact is applied to a complementary GaAs heterostructure field effect transistor. The inventive ohmic contact overcomes the drawbacks of the prior art and establishes a manufacturable device and process compatible with the modern VLSI interconnect technology. This preferred embodiment comprises the same ohmic contact material, nickel-germanium-tungsten (NiGeW or optionally GeNiW), for ohmic contacts for both the N-type devices and the P-type devices.

NiGeW is known to be suitable for contact to N-type regions. It's use as an ohmic contact is shown, for example, in co-pending U.S. patent application Ser. Nos. 07/902,244 and 07/902,245. However, a typical complementary GaAs heterostructure device has an insulating layer comprising a material such as AlGaAs having a high Al concentration. When this insulating layer is P-doped to levels of about $10^{18}$/cc as in prior art complementary devices, NiGeW would normally be unsuitable. NiGeW contact to such a P-type device is unsuitable because the Ge provides compensating N-type impurities. This is why, for example, the prior art uses AuZnNi or AuZnAu as an ohmic contact to P-type regions where Zn provides a high doping.

Nevertheless, the present invention provides for use of the typically N-type NiGeW (or GeNiW) ohmic for P-type as well. Specifically, the preferred embodiment uses a high dose co-implant of appropriate implant species to achieve a shallow high doping density in P-type contact regions in order to realize low contact resistance for the P-type devices of the complementary arrangement. The contacts are suitable for AlGaAs/- GaAs heterostructures in which the Al content can be as high as required.

The novel and non-obvious ohmic contacts are etchable with techniques such as the one disclosed in co-pending U.S. patent application Ser. No. 07/902,244. Consequently, lift-off techniques are not required. Therefore, higher yields and smaller device geometries are provided.

Furthermore, the preferred devices made in accordance with the present invention are compatible with modern Al based VLSI interconnect techniques. Also, the ohmics of the present invention are mirror smooth, specular and non-spiking. Moreover, substantial advantage over the prior art is provided because the same ohmic material can be used throughout the complementary device. Thus, processing is significantly simplified. The invention can be applied, for example, to digital and analog III–V semiconductors, complementary circuits including FETs, HBTs, and photonic devices such as semiconductor LEDs and lasers. Consequently, there is great application for communication, computing and display applications, etc.

Figure 1:
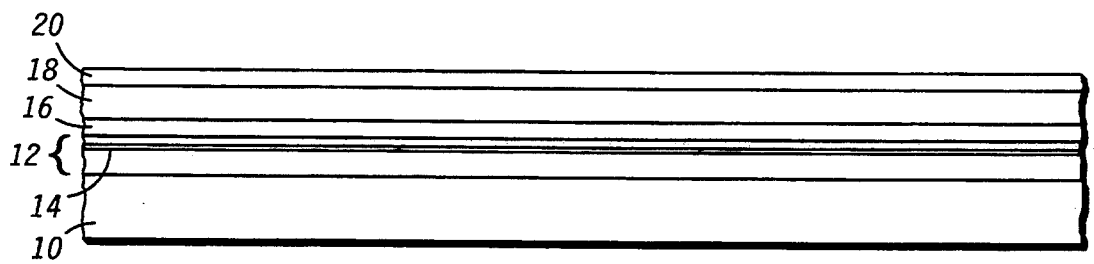
FIG. 1 is a cross-section view of an epitaxial structure of a device using the preferred contacts.

Turning to the figures, FIG. 1 is a schematic cross-section illustrating the epitaxial semiconductor structure of a device using the preferred contacts made in accordance with the present invention. A GaAs substrate 10 is provided. The GaAs substrate 10 is a high resistance material, preferably the type grown by liquid encapsulated Czocrolski (LEC) technique. The GaAs substrate 10 is preferably about 25 mils in thickness, and has a sheet resistance of approximately $10^9$ to $10^{10}$ ohms/sq. An undoped GaAs buffer layer 12 is epitaxially grown, in a manner well known in the art, on the GaAs LEC substrate 10. The GaAs buffer layer 12 is preferably approximately 2,000 Å thick. The GaAs buffer layer 12 is for providing a clean crystal lattice from which to form the active layers of the device. Within the GaAs buffer layer 12, a very narrow delta doping layer 14 is inserted. The delta doping layer 14 preferably comprises silicon (Si), having a carrier concentration of $2-4 \times 10^{11} cm^{-2}$. In the preferred embodiment, the delta doping layer 14 is disposed approximately 30 Å from the top of the GaAs buffer layer 12. The doping layer 14 functions to provide part of the carriers to the N-channel device and to adjust the threshold voltage of both the N-channel and P-channel devices.

An FET channel layer 16 is formed above the GaAs buffer layer 12. The channel layer 16 preferably comprises undoped InGaAs having a mole ratio of 20% In, 80% Ga. In the preferred embodiment, the channel layer 16 is approximately 130 Å thick.

On top of the channel layer 16, an insulating layer 18 is epitaxially grown. Preferably, the insulating layer 18 comprises undoped AlGaAs. The preferred molar ratio is 75% Al, 25% Ga. The layer has a thickness of approximately 250 Å.

A GaAs cap layer 20 is grown above the insulating layer, to a thickness of approximately 30 Å. The GaAs cap layer is for preventing the oxidation of the AlGaAs insulating layer 18.

Thus, the epitaxial semiconductor structure of FIG. 1 provides a heterostructure for forming the preferred complementary heterostructure field effect transistor device. As is apparent, the heterostructure comprises GaAs/InGaAs/AlGaAs.

FIGS. 2–9 illustrate the steps of forming a device using contacts made in accordance with the preferred method. The device is a complementary heterostructure field effect transistor.

Figure 2:
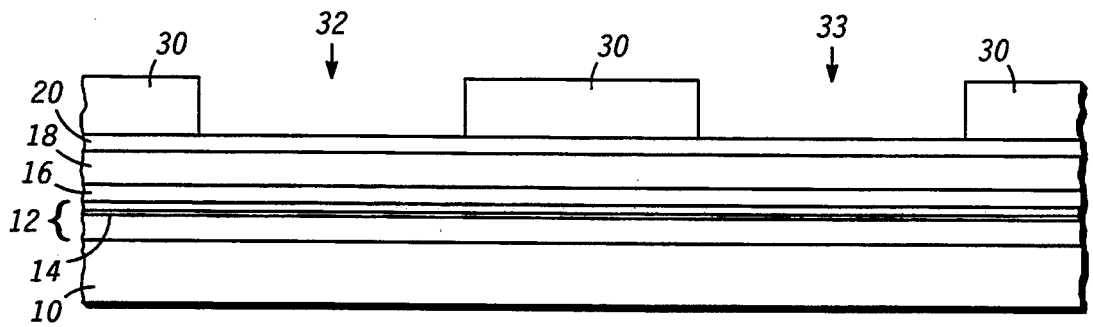
FIG. 2 is a cross-section view showing a stage in making a device using the preferred contacts just after a field dielectric is deposited.

Referring to FIG. 2, an optional field dielectric 30 is deposited to protect the substrate material. Windows are opened in the field dielectric 30 with well known lithographic and reactive ion etching (RIE) techniques. The windows provide access to active device regions 32 and 33.

Figure 3:
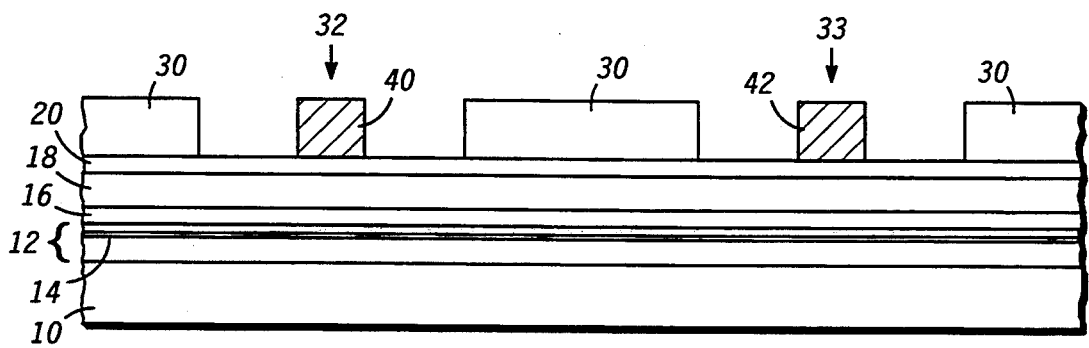
FIG. 3 is a cross-section view showing a stage in making a device using the preferred contacts just after device gates are formed.

Referring to FIG. 3, an N-device gate 40 and a P-device gate 42 are formed in regions 32 and 33, respectively. Specifically, in the preferred embodiment a layer of TiWN of approximately 3,000 to 4,000 Å is reactively sputter deposited. The TiWN serves as Schottky contact gates for the field effect devices. Gates 40 and 42 are defined by RIE techniques.

Figure 4:
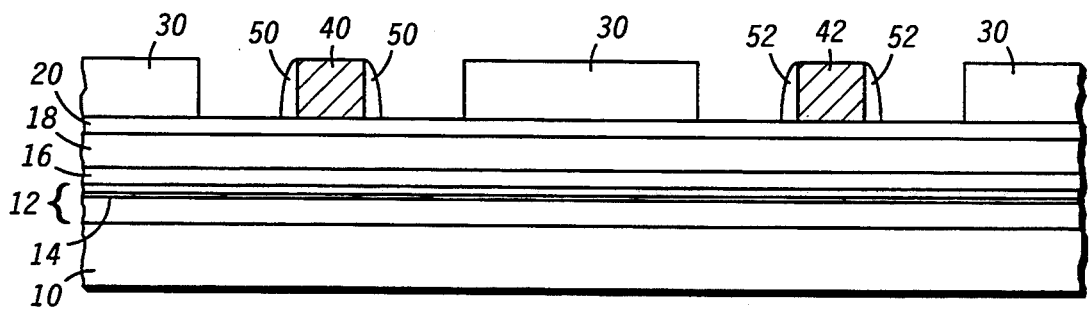
FIG. 4 is a cross-section view showing a stage in making a device using the preferred contacts just after gate sidewalls are formed.

FIG. 4 illustrates the forming of pairs of sidewall spacers 50 and 52 on opposing sides of gates 40 and 42, respectively. The sidewalls 50 and 52 are preferable, but not necessary. The sidewalls 50 and 52 function to align the source and drain regions in later steps, so as to enhance performance parameters of the overall device. In the preferred embodiment, the sidewalls 50 and 52 are formed of SiON or $SiN/SiO_2$, with total thickness of approximately 4,000 Å. The sidewalls 50 and 52 are formed with common processing methods. A high pressure anisotropic RIE process is used for etching. The resulting sidewalls 50 and 52 have a footprint alongside the respective gates of approximately 3,000 Å following the RIE.

Figure 5:
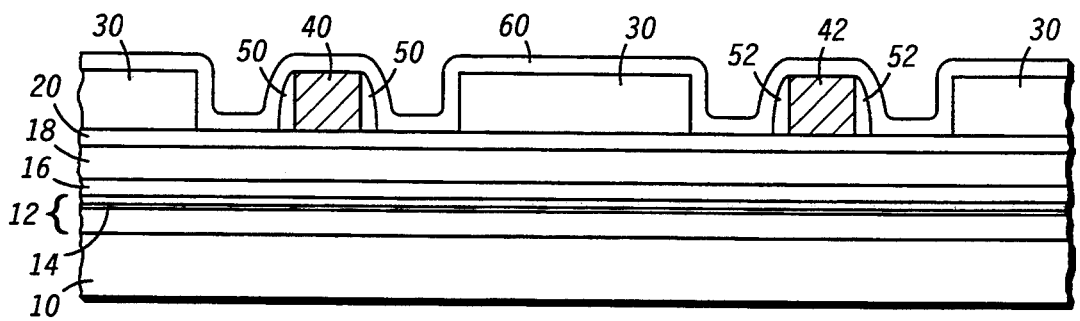
FIG. 5 is a cross-section view showing a stage in making a device using the preferred contacts just after a protective dielectric layer is formed.

FIG. 5 illustrates the deposition of a protective SiN layer 60 covering the field dielectric regions 30, the active device regions 32,33, the gates 40,42, along with the spacers 50,52. The SiN layer 60 functions to protect the wafer surface from the subsequent process steps. The layer 60 is preferably deposited with standard CVD methods to a thickness of approximately 500 Å.

Figure 6:
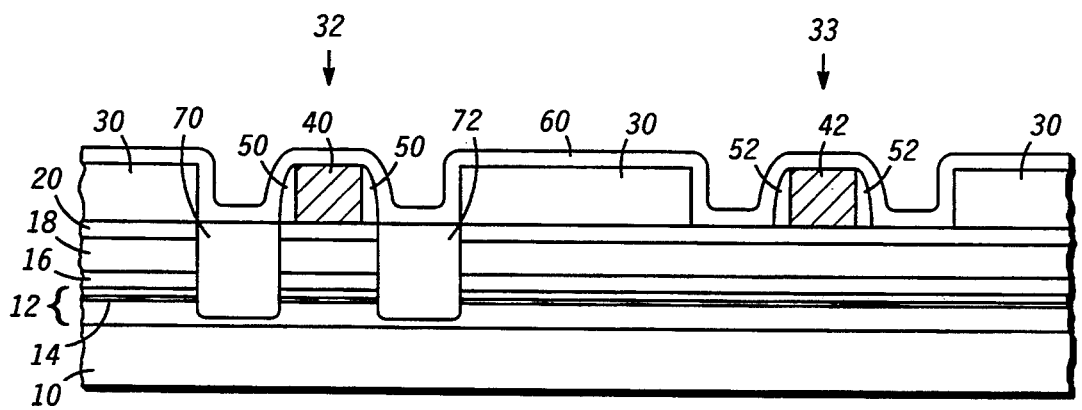
FIG. 6 is a cross-section view showing a stage in making a device using the preferred contacts just after N-source and N-drain regions are formed.

FIG. 6 illustrates the forming of an N-source region 70 and an N-drain region 72 in the active device region 32 adjacent the N-device gate 40. The regions 70 and 72 are formed with well known processing methods using Si implantation to yield a sheet resistance of approximately 350 ohms/sq. The implantation is through the SiN layer 60. N-source region 70 and N-drain region 72 each preferably extend approximately 2,000 Å into the substrate, thus extending at least to the channel layer 16, and preferably into buffer layer 12. Optionally, a lightly doped N region may be provided directly self-aligned to the N-device gate 40 with a lower dose Si implant prior to the sidewall formation, to improve the access series resistance of the N-channel FET.

Figure 7:
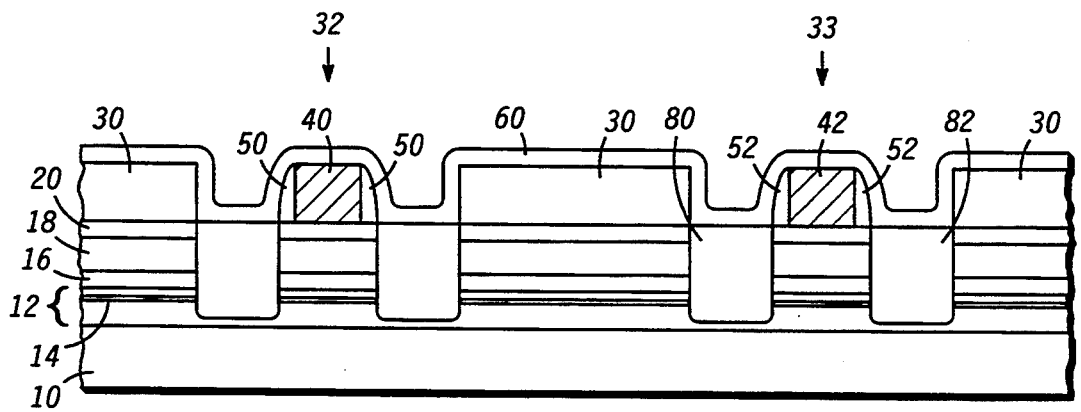
FIG. 7 is a cross-section view showing a stage in making a device using the preferred contacts just after P-source and P-drain regions are formed.

FIG. 7 illustrates the forming of P-source region 80 and P-drain region 82. The P-regions 80 and 82 are formed using co-implantation of fluorine (F) and beryllium (Be) to provide a sheet resistance of approximately 1,000–2,000 ohms/sq. P-source region 80 and P-drain region 82 each preferably extend approximately 2,000 Å into the substrate, thus extending at least to the channel layer 16, and preferably into buffer layer 12.

Figure 8:
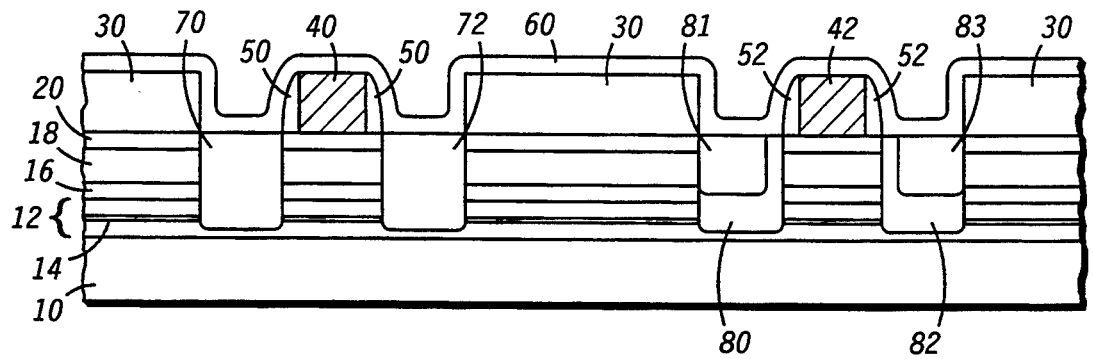
FIG. 8 is a cross-section view showing a stage in making a device using the preferred contacts just after P-source and drain regions are further doped.

FIG. 8 illustrates the further doping of the P-source region 80 and the P-drain region 82 so as to make the regions compatible for the ohmic contact used in the preferred embodiment of the present invention. Specifically, NiGeW is normally only used as N-type ohmic contact metal due to the incorporation of Ge, which is an N-type dopant for GaAs. However, the present invention utilizes NiGeW as the P-type ohmic contact as well. Consequently, in the step illustrated by. FIG. 8, the P-type source region 80 and the P-type drain region 82 are further heavily doped so as to provide shallow and high concentration P-type regions, 81 and 83, respectively. A resulting sheet resistivity of 250–400 ohms/square is preferred.

The optimized P-type dopant profile may be achieved using co-implantation of F and Be, As and Be, P and Be, N and Be or Kr and Be. In the case of F and Be, peak doping of $5 \times 10^{19}$ $cc^{-1}$ is achieved with implant doses greater than $10^{14}$ $cm^{-2}$ and energies under 50 keV with rapid annealing temperatures, referred to below, of 700°–850° C. Thus, a P-type contact is provided even though an N-type ohmic metal is used.

Although not shown, the next step in the preferred method is a rapid thermal-annealing which is used to activate the P and N source and drains. The annealing conditions are preferably temperatures of 700°–850° C. and designed to minimize slip-line generation on large wafers and to reduce P-type HFET sub-threshold currents.

Figure 9:
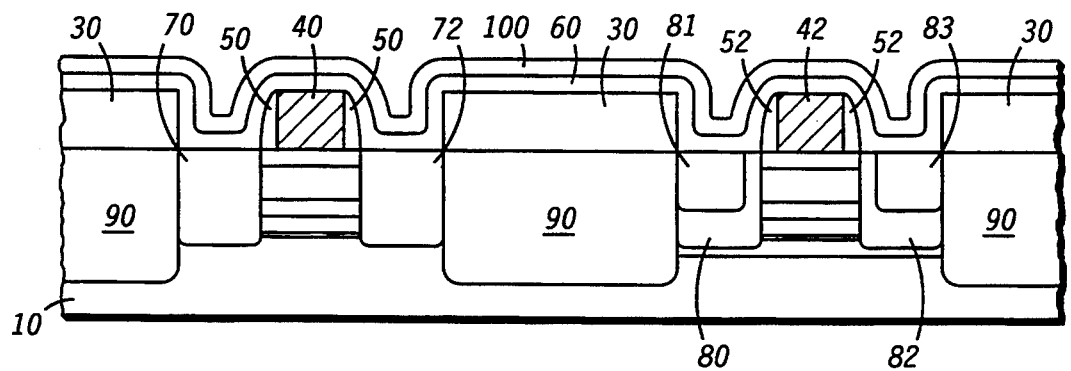
FIG. 9 is a cross-section view showing a stage in making a device using the preferred contacts just after isolation regions are formed.

FIG. 9 illustrates the forming of oxygen isolation (ISO) regions 90 in the epitaxial substrate, between the N-channel devices and the P-channel devices. The ISO regions 90 function to electrically isolate the respective devices. It will be understood that the N-device and P-device shown are two of many identical devices formed on a particular die. Consequently, regions 90 are shown at the edges of the figure to indicate isolation from neighboring devices not shown. The ISO uses a rapid thermal annealing which is preferably carried out at 550° C. for six seconds.

FIG. 9 also illustrates an additional dielectric cap 100 covering the whole device. The cap 100 is provided for protection during further processing steps. The dielectric cap 100 is formed using conventional processing methods to a thickness of approximately 3,500 Å.

Figure 10:
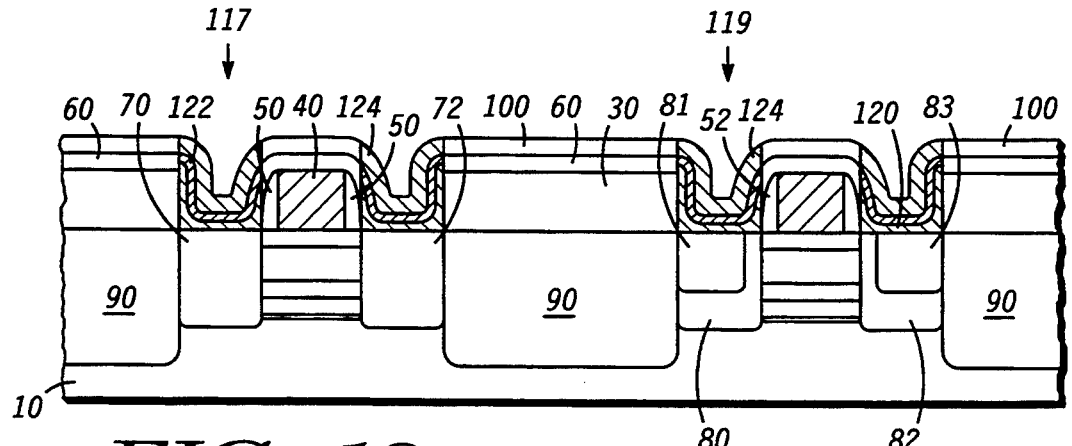
FIG. 10 is a cross-section view showing a stage in making a device using the preferred contacts just after ohmic contacts are formed.

FIG. 10 illustrates the ohmic contacts of the preferred embodiment of the present invention. Although not shown, the dielectric layer 100 and the dielectric layer 60 are etched away in areas above the N-source, N-drain, P-source and P-drain regions 70, 72, 80 and 82 to provide access for deposition of the ohmic contacts. In the preferred embodiment, Ni layer 120, Ge layer 122 and W layer 124 are sputter deposited. However, in another embodiment envisioned, Ge is deposited first, before Ni. For ease of description, the ohmic contact to N-source region 70 will be referred to as ohmic region 117. Similarly, the ohmic contact to P-source region 80 will be referred to as ohmic region 119. These exemplify all the ohmic contacts.

Exemplary ohmic regions 117 and 119 are formed as follows. In an embodiment employing lift-off techniques to define the contact regions, thin layers are required for the metals. In this embodiment, Ni layer 120 is 100–300 Å and Ge layer 122 is 100–300 Å. Finally, W layer 124 is deposited to a thickness of approximately 1,000 Å. In an alternate embodiment, where Ge is deposited before Ni, similar thicknesses are used.

Note that employing etching to define contact regions is also desirable. Any reasonable W thickness can be used when the contacts are defined with etching techniques, such as RIE of the W and Ge and well known chemicals such as buffered oxide etchant (BOE) or hydrochloric acid (HCl) for the nickel. Acceptable techniques are disclosed in co-pending U.S. patent application Ser. No. 07/902,244, although others may be employed.

For the N-channel regions, the ohmic contact material works suitably for the Si doped N-type source and drain regions, so long as the sheet resistivity is less than 1,000 ohms/sq. The ohmic contacts are sputter deposited on the implanted and annealed semiconductor after initial pre-cleaning using wet etching with BOE and HCl.

When sintered in the temperature range 500° C. to 600° C., stable NiGe and NiAs compounds form an interface of the ohmic metal and the semiconductor material. The NiAs compound may form at lower temperatures and may be interspersed in the NiGe matrix. Both these compounds form low barriers to the semiconductor allowing tunneling conduction.

In order to use the NiGeW (or GeNiW) ohmic contacts for P-type devices, a high concentration of P-type doping is provided in the P-type III-V heterostructure by shallow ion implantation process, as described above with reference to FIG. 8. This ensures that the NiGeW metal contacts a highly doped P-type region despite diffusion of the N-type Ge dopants into the semiconductor.

The W layer 124, which is a refractory metal, may optionally be a different stable refractory metal such as WN, TiW, or TiWN. The refractory cap provides a barrier to As diffusion into Al metallization which may be employed in VLSI interconnection as discussed previously.

FIG. 11 illustrates typical contact resistance of NiGeW ohmics on P-type $Al_{0.75}Ga_{0.25}As/In_{0.20}Ga_{0.80}As$ structures. The resistance is plotted versus sheet resistivity of the co-implanted F/Be P-regions 81 and 83. Contact resistance values ranging from 0.22–0.85 ohm-mm may be achieved by changing the surface concentration of the P-type doping. Consequently, it can be seen that, in accordance with the present invention, the same NiGeW ohmic contact, formerly only used for N-type contacts, can be employed usefully in a complementary III-V device which requires P-contacts as well.

FIG. 12 illustrates the temperature advantages of the ohmic contacts in accordance with the present invention. The graph illustrates that NiGeW ohmics maintain their useful ohmic contact resistance within a temperature range of 500°–600° C., while the prior art Au based ohmic begins to rapidly degrade well below 500° C. Modern Al VLSI interconnect processes are conducted at a temperature of 500° C. or higher. Therefore, the prior art Au ohmics cannot be used, whereas the ohmics according to the present invention can be used.

By now it should be appreciated that there has been provided a novel and non-obvious method of making ohmic contacts to a complementary semiconductor device. The ohmic contacts are particularly advantageous for use with modern VLSI aluminum interconnection techniques. Additionally, providing the same type ohmic contact for N as well as P devices greatly simplifies processing.

We claim:

1. A method of making ohmic contacts to a complementary semiconductor device comprising the steps of:
    forming an N-type region in a gallium arsenide epitaxial structure by means of a single doping step;
    forming a P-type region in the gallium arsenide epitaxial structure;
    heavily doping the P-type region by co-implanting beryllium and a dopant selected from the group consisting of fluorine, arsenic, phosphorus, nitrogen and krypton, to create a sheet resistance in the range of 250–400 ohms per square;
    activating the N-type region and P-type region by thermal annealing;
    depositing nickel on the N-type region and the P-type region;
    depositing germanium on the deposited nickel; and
    depositing tungsten on the deposited germanium.

2. The method of claim 1, wherein the step of forming the N-type region comprises doping with silicon.

3. The method of claim 1, wherein the step of forming the P-type region comprises doping with fluorine and beryllium.

4. The method of claim 1, further comprising the step of forming a delta-doped region as part of the gallium arsenide epitaxial structure.

5. The method of claim 1, further comprising the step of forming an indium gallium arsenide channel region as part of the gallium arsenide epitaxial structure.

6. The method of claims 1, further comprising the step of forming an aluminum gallium arsenide insulator region as part of the gallium arsenide epitaxial structure.

* * * * *